(12) United States Patent
Puma

(10) Patent No.: US 7,106,141 B2
(45) Date of Patent: Sep. 12, 2006

(54) PHASE LOCKED LOOP

(75) Inventor: Giuseppe Li Puma, Bochum (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/077,635

(22) Filed: Mar. 11, 2005

(65) Prior Publication Data

US 2005/0212605 A1  Sep. 29, 2005

Related U.S. Application Data

(63) Continuation of application No. PCT/DE03/02695, filed on Aug. 11, 2003.

(30) Foreign Application Priority Data

Sep. 12, 2002  (DE) ................ 102 42 364

(51) Int. Cl.
*H03L 7/00* (2006.01)
(52) U.S. Cl. .............. 331/16; 331/1 A; 331/175; 331/177 R
(58) Field of Classification Search ............ 331/17, 331/16, 177 R, 175, 1 A
See application file for complete search history.

(56) References Cited

U.S. PATENT DOCUMENTS 5,126,692 A  6/1992  Shearer et al.
5,631,587 A  5/1997  Co et al.
6,163,184 A  12/2000 Larsson
6,724,265 B1 *  4/2004  Humphreys ............... 331/17
2002/0039050 A1  4/2002  Griffith et al.

FOREIGN PATENT DOCUMENTS

DE  199 54 255 A1  6/2000
DE  101 32 799 A1  10/2002
EP  0 961 412 A1  12/1999
EP  1 244 215 A1  9/2002

* cited by examiner

*Primary Examiner*—Arnold Kinkead
(74) *Attorney, Agent, or Firm*—Eschweiler & Associates, LLC

(57) ABSTRACT

The phase locked loop according to the invention has an adjustable charge pump (2) which is intended to generate a control voltage (UVCO). A voltage-controlled oscillator (4) and an evaluation unit (14) are connected downstream of said charge pump. In this case, the evaluation unit (14) is designed in such a manner that it can be used to generate a correction signal (Iref) using the control voltage (UVCO) and a nominal gradient ($\hat{K}_{vco}$) of the voltage-controlled oscillator (4) and to apply said signal to the evaluation output. The latter is, in turn, connected to an input of the charge pump (2).

20 Claims, 3 Drawing Sheets

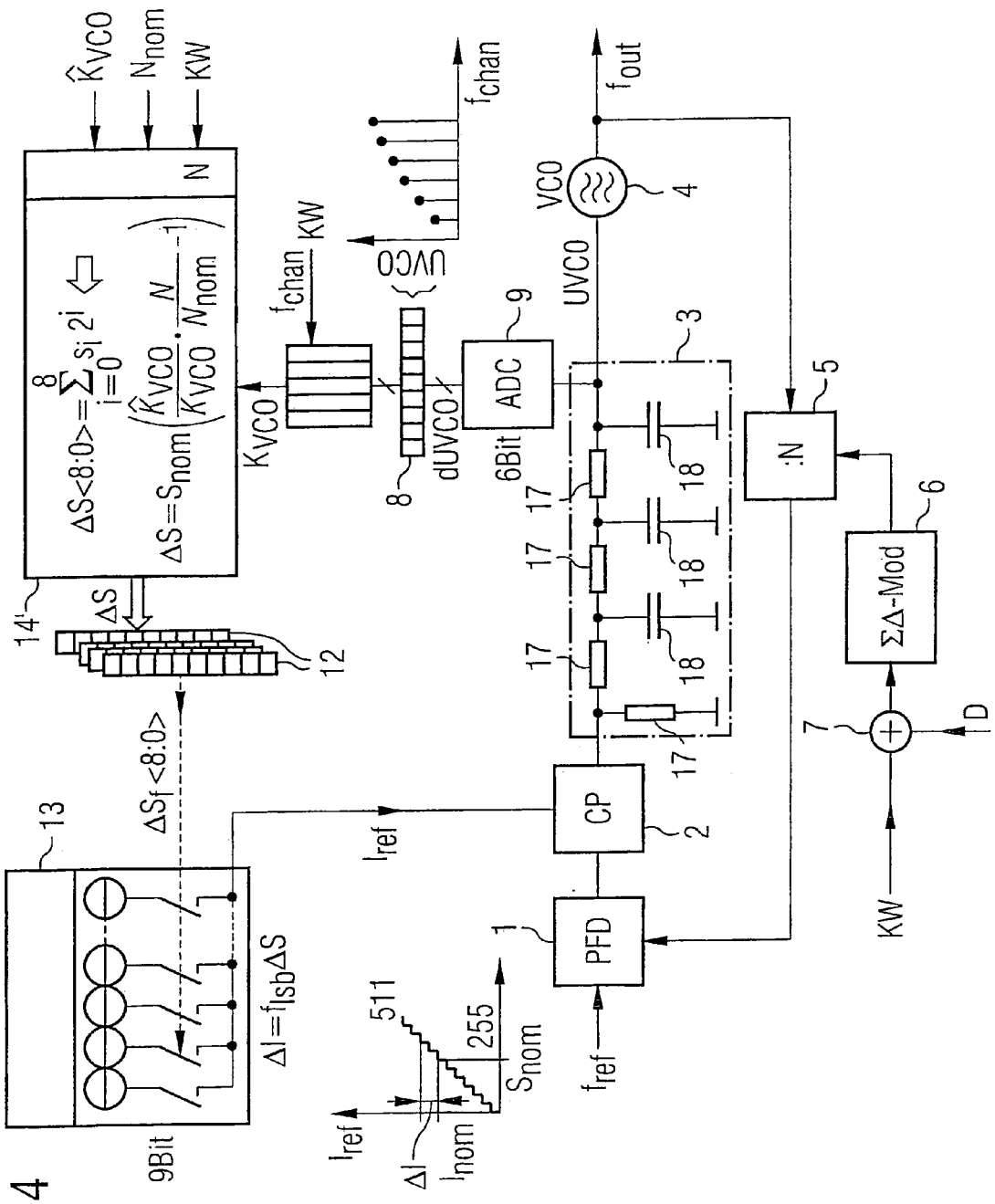

PHASE LOCKED LOOP

REFERENCE TO RELATED APPLICATIONS

This application is a continuation of PCT/DE03/02695 filed Aug. 11, 2003, which was not published in English, which claims the benefit of the priority date of German Patent Application No. DE 102 42 364.4, filed on Sep. 12, 2002, the contents of which both are herein incorporated by reference in their entireties.

FIELD OF THE INVENTION

The invention relates to a phase locked loop for frequency-modulating a transmitter, as can be used, for example, in a mobile radio system.

BACKGROUND OF THE INVENTION

A low-complexity implementation of a transmitter design for modern mobile radio systems for frequency modulation is provided by a $\Sigma\Delta$ fractional-N phase locked loop, which is also referred to below as a $\Sigma\Delta$ fractional-N PLL or else just as a PLL.

The PLL 10, as shown in FIG. 1, comprises a phase/frequency detector 1, a charge pump 2, a loop filter 3, a voltage-controlled oscillator 4 (VCO for short) and a frequency divider 5. Applied to one input of the PLL 10 is a reference frequency fref whose phase is compared, by means of the phase/frequency detector 1, with a phase of a frequency fdiv that results from an output frequency fvco which has been divided by a division value N. If necessary, the phase/frequency detector 1 generates an actuating signal and supplies it to the charge pump 2, which takes said actuating signal as a basis for generating a voltage U which, once filtered by means of the filter 3, is applied to the input of the voltage-controlled oscillator 4 as a tuning voltage UVCO. Said voltage-controlled oscillator, in turn, generates the output frequency fvco, which is dependent on the tuning voltage UVCO.

The frequency modulation desired is effected digitally by varying the frequency division value N with the aid of a $\Sigma\Delta$ modulator 6. Digital transmission data D are combined with a channel word KW using an adder 7 and are supplied to the $\Sigma\Delta$ modulator 6, which then uses them to determine the division value N which it supplies to the frequency divider 5. In this case, the channel word KW prescribes the channel.

When a non-integrating loop filter 3 is used, the transmission bandwidth of the phase locked loop 10 is directly proportional to the VCO gradient Kvco. The transfer function $H(j\omega)$ of the closed control loop 10 is determined as follows:

$$H(j\omega) = \frac{\varphi vc}{\varphi re} = \frac{N}{1 + j\omega\omega/f_0} \qquad (1)$$

where
$\varphi vco$ is the phase at the PLL output,
$\varphi ref$ is the phase at the PLL input,
$\omega$ is the angular frequency, and
N is the division value.

The cut-off frequency f0 of the −3 dB bandwidth of the PLL 10 is calculated from:

$$f0 = \frac{Kp \cdot R \cdot Kvco}{N} \qquad (2)$$

where
Kp is the phase detector gradient,
R is the loop resistance to ground, and
Kvco is the VCO gradient.

The phase detector gradient Kp is proportional to the charge pump current Icp.

The document U.S. 2002/0039050 A1 specifies a synthesizer having a charge pump in which the charge pump current is compensated for relative to the tuning curve of the VCO. In this case, the charge pump current of the charge pump (which is connected between the phase detector and the oscillator) is matched as a function of the magnitude of a frequency control signal at the input of the voltage-controlled oscillator.

The prior art has hitherto not disclosed a PLL which can be used to firmly set the DC voltage no-load gain and cut-off frequency across all channels and all tolerances.

SUMMARY OF THE INVENTION

The present invention provides a phase locked loop, in accordance with an aspect of the present invention, in which it is possible to firmly set a constant DC no-load gain and cut-off frequency across all channels and all tolerances.

The phase locked loop according to the invention has an adjustable charge pump which is intended to generate a control voltage. A voltage-controlled oscillator and an evaluation unit are connected downstream of said charge pump. In this case, the evaluation unit is designed in such a manner that it can be used to generate a correction signal using the control voltage and a nominal gradient of the voltage-controlled oscillator and to apply said signal to the evaluation output. The latter is, in turn, connected to an input of the charge pump.

In accordance with one aspect of the invention, the evaluation unit is designed in such a manner that it can be used to calculate the gradient error of the voltage-controlled oscillator.

In accordance with another aspect of the present invention, the phase locked loop includes an analog/digital converter for converting the control voltage into a digital word is connected upstream of the evaluation unit.

In another aspect of the invention, a register for storing the digital word is connected between the evaluation unit and the analog/digital converter.

A table memory may be connected between the evaluation unit and the register in order to ascertain the actual value of the gradient of the voltage-controlled oscillator using the digital word and a channel word.

The evaluation unit may furthermore have a processing unit in order to calculate a gradient error from the actual value of the gradient of the voltage-controlled oscillator, the channel word and the nominal gradient of the voltage-controlled oscillator.

In another aspect of the invention, a plurality of registers are connected downstream of the evaluation unit in order to store a respective gradient error for a plurality of channel groups.

A controllable current source is connected downstream of the evaluation unit in order to generate the correction signal from the gradient error.

In addition, the phase locked loop according to the invention may contain a loop filter which is connected between the charge pump and the voltage-controlled oscillator.

In another aspect of the invention, the feedback path may furthermore contain a divider. The divider can have a division value which can be settable using a ΣΔ modulator.

BRIEF DESCRIPTION OF THE DRAWINGS

The invention will be explained further in the following text using a plurality of exemplary embodiments and with reference to four figures, in which:

FIG. 4 shows the basic design of a second embodiment of the phase locked loop according to the invention in the form of a block diagram.

DETAILED DESCRIPTION OF THE INVENTION

Figure 1:
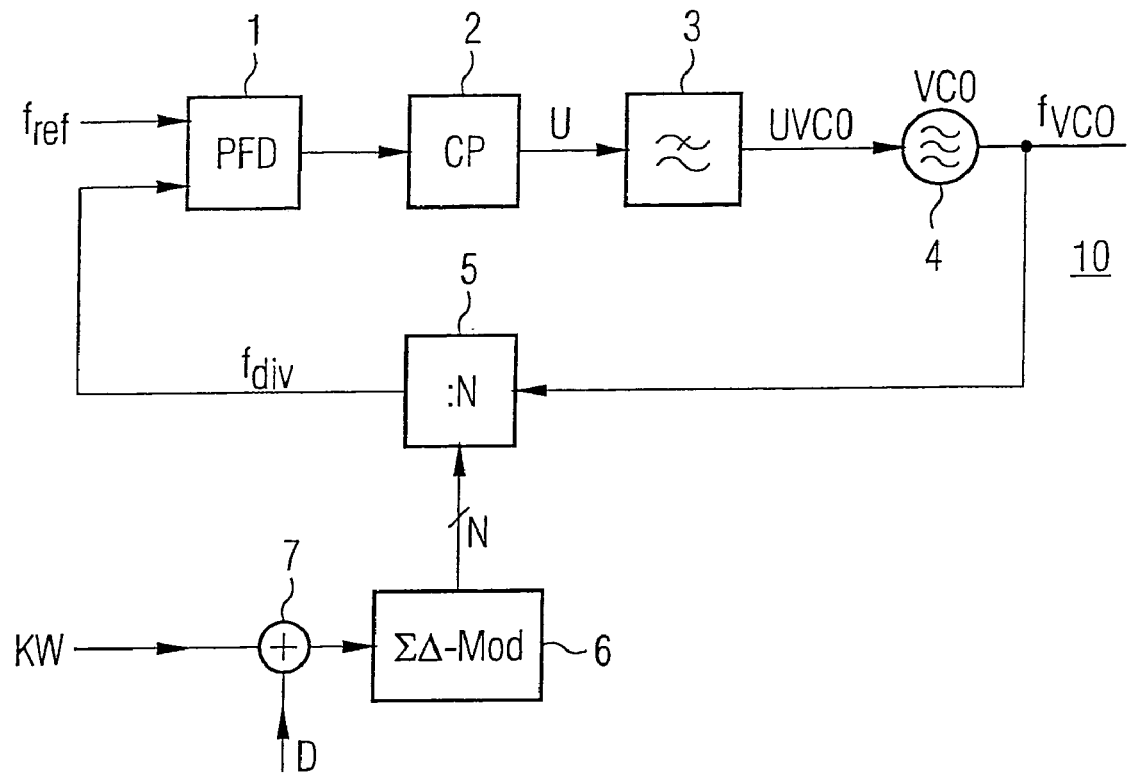
FIG. 1 shows a phase locked loop, as is known from the prior art.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

As can be seen from formula (2) for the cut-off frequency and bandwidth, the cut-off frequency is proportional to:

$$Icp*R*Kvco/N \quad (3)$$

and is also proportional to the ring gain RV. The product Icp*R defines the control range of the VCO 4 and cannot be varied as desired on account of limitation by the supply voltage. One possible way of setting the PLL bandwidth and the DC ring gain RV is to accurately set the VCO gradient Kvco. Since, however, the VCO gradient Kvco varies on account of process fluctuations, a compensation method needs to ensure that the cut-off frequency f0 remains constant. The product Icp*R is virtually independent of technology fluctuations and is thus constant provided that the current Icp is derived from the same type of resistance.

Figure 2:
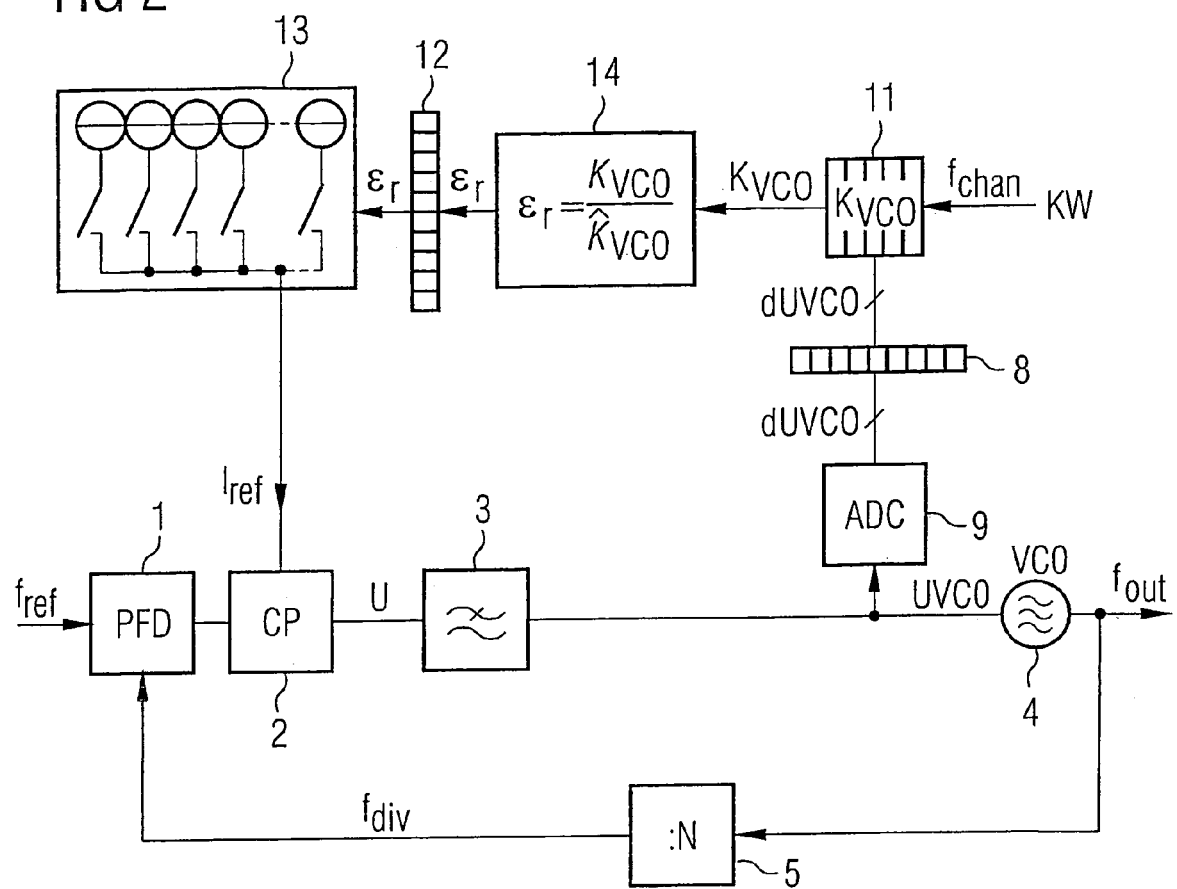
FIG. 2 shows the basic design of a first embodiment of the phase locked loop according to the invention in the form of a block diagram.

FIG. 2 shows the basic design of a first embodiment of the phase locked loop according to the invention. The reference frequency fref is applied to the first input of the phase/frequency detector 1. The output frequency fout which has been divided by the division value N and is denoted using fdiv is applied to the second input of the phase/frequency detector 1. If the phase of the frequency fdiv which has been divided by the division value N differs from the phase of the reference frequency fref, the phase/frequency detector 1 generates a control signal in order to generate a corrected output voltage U using the charge pump 2. The output voltage U is filtered using the low-pass filter 3 and is routed, as tuning voltage UVCO, both to the input of the voltage-controlled oscillator 4 and to the input of an analog/digital converter 9. The voltage-controlled oscillator 4 then generates an output frequency fout which has been matched to the tuning voltage UVCO. The analog/digital converter 9 is used to convert the tuning voltage UVCO into a digital word dUVCO. The output of the analog/digital converter 9 is connected to a register 8 which buffer-stores the digital word dUVCO. A table memory 11 is, in turn, connected downstream of the register 8. The digital word dUVCO and a channel word KW (which is likewise routed to the table memory 11) are used to ascertain the actual gradient Kvco of the VCO 4 using the table stored in the table memory 11. The gradient Kvco of the VCO 4 is supplied to an evaluation unit 14 which uses it, together with a nominal gradient $\hat{K}$vco, to calculate a gradient error εr and stores the latter in a further register 12. A programmable current source 13 is used to convert the gradient error εr into a reference current Iref, which is also referred to as a correction signal. The charge pump 2, whose input side is connected, on the one hand, to the phase/frequency detector 1 and, on the other hand, to the output of the programmable current source 13, now uses the actuating signal—which originates from the phase/frequency detector 1—and the reference current Iref to ascertain a corresponding output voltage U.

As in the embodiment of the PLL 10 in FIG. 1, the division value N can be ascertained with the aid of the ΣΔ modulator 6, the adder 7, the channel word KW and the digital data signal D, without this being explicitly shown in FIG. 2.

Figure 3:
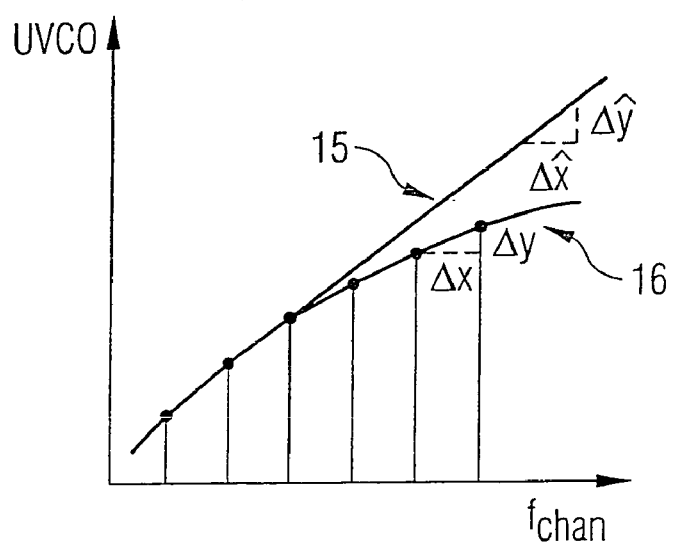
FIG. 3 shows a frequency graph showing the profile of the gradient of a voltage-controlled oscillator as a function of the frequency.

FIG. 3 shows a frequency graph in which the channel frequency fchan is plotted on the x-axis and the tuning voltage UVCO is plotted on the y-axis. Reference symbol 15 is used to denote the ideal tuning characteristic and reference symbol 16 is used to denote the tuning characteristic which has been measured. The slope of the ideal tuning characteristic 15 corresponds to the nominal value of the gradient $\hat{K}$vco of the VCO 4 and is calculated from:

$$\hat{K}vco = \frac{\Delta \hat{y}}{\Delta \hat{x}} \quad (4)$$

The slope of the tuning characteristic 16 which has been measured corresponds to the actual value of the gradient Kvco of the VCO 4 and is calculated from:

$$Kvco = \frac{\Delta y}{\Delta x} \quad (5)$$

It can be seen that the actual value of the gradient Kvco decreases as the frequency increases. The discrepancy between the actual value Kvco of the gradient and the nominal value of the gradient $\hat{K}$vco results in the relative gradient error εr as follows:

$$\epsilon r = \frac{Kvco}{\hat{K}vco} \quad (6)$$

FIG. 4 shows a second embodiment of the phase locked loop according to the invention in the form of a block diagram. In this case, the low-pass filter 3 is formed by the combination of resistors 17 and capacitors 18.

The evaluation unit 14, as shown in FIG. 2, has been replaced with a modified evaluation unit 14'. The programmable current source 13 is controlled using the parameters ΔS, which are calculated for each channel frequency fchan and channel word KW using the following formula:

$$\Delta S = Snom \cdot \frac{\hat{K}vco}{Kvco} \cdot \frac{N}{Nnom} 1 \qquad (7)$$

and are buffer-stored in the register banks 12.

As shown in the diagram illustrated on the left in FIG. 4, the reference current Iref can assume 511 different values if the reference current source 13 operates with a resolution of 9 bits. The reference current (correction signal) Iref is equal to Inom given a value of Snom=255. The change in the reference current ΔI results from:

$$\Delta I = Ilsb \cdot \Delta S \qquad (8)$$

where Ilsb is the minimum possible change in the reference current Iref. Ilsb results from the resolution accuracy of the programmable current source 13.

The way in which the invention works will be described in even more detail below. In a first operation, the PLL locks onto a particular channel prescribed by the channel word KW. After the "settling time" of the PLL, the analog/digital converter 9 converts the tuning voltage UVCO of the VCO 4 into a digital word dUVCO, which is stored in the register 8. This operation is then carried out for a plurality of frequency channels, so that the tuning gradient Kvco of the VCO 4 can be calculated from the channel word KW—which corresponds to the channel frequency fchan which has been set—and the amplitude-discretized values dUVCO of the tuning voltage UVCO. Since the nominal value of the VCO gradient $\hat{K}$ vco is known a priori (see FIG. 3), the relative error Er, as already stated in equation (6) above, can be calculated as follows:

$$\epsilon r = \frac{Kvco}{\hat{K}vco} \qquad (6)$$

In order to compensate for the error εr, the reference current Iref—which can be set digitally—of the charge pump 2 is changed on the basis of the resultant error εr. In this case, the change in the division value N also needs to be taken into account and compensated for in accordance with the channel set. However, this may be effected using the channel word KW, which contains the information about the division value N. So that this compensation operation does not have to be effected before each slot or time slot when used in a time division multiple access (TDMA) system, for example Digital European Cordless Telephone (DECT), WDCT or Bluetooth, this operation can be effected once after the device has been switched on, for example within the reset task. The operation can be effected successively for particular channel groups. The actuating bits for the reference current Iref which can be set digitally are stored for the various channels and channel groups in the register 12, with the result that, after the channel word KW has been programmed, the corresponding reference current values Iref can be read from the registers 12 during normal operation.

The solution according to the invention provides a simple implementation for compensating for the PLL ring gain RV:

$$RV \approx \frac{Icp \cdot R \cdot Kvco}{N} \qquad (9)$$

The ring gain RV and thus the cut-off frequency of the phase locked loop vary on account of the non-linear VCO characteristic and the variation in the division factor N across the channels. On account of the manner in which the VCO tuning characteristic or gradient Kvco is determined, digitized and then compensated for by changing the charge pump reference current Iref, it is possible to set a virtually constant PLL ring gain RV and cut-off frequency.

In the exemplary embodiment in FIG. 4, the VCO 4 has a typical tuning gradient of 60 MHz. The digitally programmable reference current can be set using 9 bits, thus resulting in a resolution of 0.4% given a nominal current Inom which corresponds to the decimal value 255. The analog/digital converter 9 is used to digitize the value of the tuning voltage UVCO using 6 bits, corresponding to a maximum resolution of 1.5%. The evaluation unit 14' receives the nominal values for the division factor Nnom and for the VCO gradient $\hat{K}$ vco as input parameters and also receives the channel word KW for the purpose of ascertaining the current division value N.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

LIST OF REFERENCE SYMBOLS

1 Phase/frequency detector
2 Charge pump
3 Loop filter
4 VCO
5 Frequency divider
6 ΣΔ modulator
7 Adder
8 Register
9 Analog/digital converter
10 PLL
11 Table memory
12 Register bank
13 Current source
14 Evaluation unit
14' Modified evaluation unit
15 Ideal tuning voltage 16 Measured tuning voltage
17 Resistor
18 Capacitor
N Division value
U Output voltage of the charge pump
KW Channel word
D Digital signal data
UVCO Tuning voltage
dUVCO Digitized tuning voltage
fout Output frequency
fref Reference frequency
Iref Reference current
fchan Channel frequency

What is claimed is:

1. A phase locked loop comprising:
an adjustable charge pump that generates a control voltage according to a control signal and a correction signal;
a voltage controlled oscillator that receives the control voltage and generates an output frequency according to the control voltage;
an analog to digital converter that receives the control voltage and generates a digital word therefrom;
a first register that receives and stores the digital word from the analog to digital converter;
a table memory that receives the digital word from the register and also receives a channel word and forms a table entry comprising an actual gradient from the digital word and the channel word;
an evaluation unit that receives the table entry from the table memory and generates a gradient error therefrom;
a second register that receives and stores the gradient error from the evaluation unit; and
a programmable current source that receives the gradient error from the second register and generates the correction signal according to the gradient error.

2. The phase locked loop of claim 1, wherein the evaluation unit comprises a processing unit that calculates the gradient error.

3. The phase locked loop of claim 1, further comprising a loop filter that filters the control voltage generated by the charge pump.

4. The phase locked loop of claim 1, further comprising a phase/frequency detector that receives a reference frequency and a divided frequency and generates the control signal according to the reference frequency and the divided frequency.

5. The phase locked loop of claim 4, further comprising a feedback path comprising a frequency divider that divides the output frequency to generate the divided frequency.

6. The phase locked loop of claim 5, wherein the phase frequency detector generates the control signal when the divided frequency differs from the reference frequency.

7. The phase locked loop of claim 5, further comprising a sigma delta modulator that sets a frequency division value on the frequency divider.

8. The phase locked loop of claim 7, wherein the sigma delta modulator sets the frequency division value according to the channel word and a digital data signal.

9. A phase locked loop comprising:
a phase/frequency detector that generates a control signal according to reference frequencies and divided frequencies;
an adjustable charge pump that generates control voltages according to the control signal and a correction signal;
a voltage controlled oscillator that receives the control voltages and generates an output frequencies according to the control voltages;
an analog to digital converter that receives the control voltages and generates digital words therefrom;
a first register that receives and stores the digital words from the analog to digital converter;
a table memory that receives the digital words from the register and also receives channel word and forms table entries comprising actual gradients according to the respective digital words and the channel words over a plurality of frequency channels;
an evaluation unit that receives the table entries from the table memory and generates gradient errors and a delta error over the plurality of frequency channels;
a second register that receives and stores the delta error from the evaluation unit; and
a programmable current source that receives the delta error from the second register and generates the correction signal according to the delta error.

10. The phase locked loop of claim 9, wherein the programmable current source has a resolution of 9 bits.

11. The phase locked loop of claim 9, wherein the evaluation unit determines tuning gradients from the channel words that correspond to the plurality of frequency channels and generates the delta error at least partially according to the tuning gradients.

12. The phase locked loop of claim 9, further comprising a feedback path comprising a frequency divider that divides the output frequencies to generate the divided frequencies.

13. The phase locked loop of claim 12, further comprising a sigma delta modulator that sets a frequency division value on the frequency divider.

14. A method of operating a phased locked loop comprising:
generating a control voltage according to a control signal and a correction signal;
generating an output frequency according to the control voltage;
obtaining a digital word from the control voltage;
determining an actual gradient at least partially according to the digital word and a channel word using a table memory;
generating a gradient error at least partially according to the actual gradient and a nominal gradient; and
generating the correction signal according to the gradient error.

15. The method of claim 14, generating the correction signal is performed by a programmable current source.

16. The method of claim 14, further comprising low-pass filtering the control voltage prior to generating the output frequency.

17. The method of claim 14, further comprising generating a divided frequency by dividing the output frequency by a division value.

18. The method of claim 17, further comprising generating the control signal by comparing frequency values of the reference frequency and the divided frequency.

19. The phase locked loop of claim 1, wherein the evaluation unit further generates the gradient error based on the actual gradient and a nominal gradient.

20. The phase locked loop of claim 9, wherein the evaluation unit generates the gradient errors based on the actual gradients and on nominal gradients over a plurality of frequemcy channels.

* * * * *

UNITED STATES PATENT AND TRADEMARK OFFICE
CERTIFICATE OF CORRECTION

| | | |
|---|---|---|
| PATENT NO. | : 7,106,141 B2 | |
| APPLICATION NO. | : 11/077635 | |
| DATED | : September 12, 2006 | |
| INVENTOR(S) | : Giuseppe Li Puma | |

It is certified that error appears in the above-identified patent and that said Letters Patent is hereby corrected as shown below:

Column 8, line 65: Please replace the word "frequemcy" with the word --frequency--.

Signed and Sealed this

Sixth Day of February, 2007

JON W. DUDAS
*Director of the United States Patent and Trademark Office*